(12) United States Patent
Tomita et al.

(10) Patent No.: US 7,683,807 B2
(45) Date of Patent: Mar. 23, 2010

(54) VARIABLE-LENGTH-CODE DECODING DEVICE

(75) Inventors: Hiroto Tomita, Fukuoka (JP); Takashi Hashimoto, Hyogo (JP)

(73) Assignee: Panasonic Corporation, Osaka (JP)

( * ) Notice: Subject to any disclaimer, the term of this patent is extended or adjusted under 35 U.S.C. 154(b) by 138 days.

(21) Appl. No.: 10/582,611

(22) PCT Filed: Mar. 11, 2005

(86) PCT No.: PCT/JP2005/004863

§ 371 (c)(1),
(2), (4) Date: Oct. 29, 2008

(87) PCT Pub. No.: WO2005/088840

PCT Pub. Date: Sep. 22, 2005

(65) Prior Publication Data

US 2009/0051573 A1    Feb. 26, 2009

(30) Foreign Application Priority Data

Mar. 12, 2004  (JP) .............................. 2004-070417

(51) Int. Cl.
*H03M 7/38* (2006.01)
(52) U.S. Cl. .......................................... 341/51; 341/67
(58) Field of Classification Search .................. 341/51, 341/67, 68, 65, 94; 711/200
See application file for complete search history.

(56) References Cited

U.S. PATENT DOCUMENTS 5,923,815 A    7/1999  Park

| | | | |
|---|---|---|---|
| 5,990,812 A * | 11/1999 | Bakhmutsky | ................. 341/67 |
| 7,035,292 B1 * | 4/2006 | Giorgetta et al. | ............ 370/509 |
| 2001/0010074 A1 | 7/2001 | Nishihara et al. | |
| 2002/0164080 A1 | 11/2002 | Igarashi et al. | |
| 2003/0043917 A1 | 3/2003 | Bublil et al. | |

FOREIGN PATENT DOCUMENTS

| | | |
|---|---|---|
| JP | 9-233429 | 9/1997 |
| JP | 2000-50263 | 2/2000 |
| JP | 2000-261324 | 9/2000 |
| JP | 2001-202236 | 7/2001 |
| JP | 2002-141807 | 5/2002 |
| JP | 2002-516501 | 6/2002 |
| JP | 2002-261623 | 9/2002 |
| JP | 2003-347927 | 12/2003 |

* cited by examiner

*Primary Examiner*—Rexford N Barnie
*Assistant Examiner*—Joseph Lauture
(74) *Attorney, Agent, or Firm*—Wenderoth, Lind & Ponack, L.L.P.

(57) ABSTRACT

A variable-length-code decoding device decodes bit streams encoded in conformity with a plurality of coding systems. The device includes a decoding unit (100) decoding variable length codes encoded by the plurality of coding systems, a stream input unit (10) inputting the variable length codes, and an interface (30) interfacing the decoding unit with the stream input unit. The stream input unit and the interface are shared in the plurality of coding systems. The necessity of providing stream input units for every coding systems is removed, thereby an increase in circuit area can be suppressed. Since the interface connects the stream input unit and the decoding unit, application of this invention to other coding systems or to other combinations of coding systems is easily realized.

4 Claims, 7 Drawing Sheets

VARIABLE-LENGTH-CODE DECODING DEVICE

BACKGROUND OF THE INVENTION

1. Field of the Invention

The present invention relates to a variable-length-code decoding device operable to decode bit streams encoded with a plurality of coding systems.

2. Description of the Related Art

The importance of the signal processing device in conformity with MPEG (Moving Picture Coding Experts Group) standards is increasing by the spread of transmission and reception of the digital image contents using digital satellite broadcasting service, the Internet, or portable information terminals. Currently, the MPEG standards include various coding systems, such as MPEG-1 for storage media, e.g. CD-ROM, MPEG-2 for digital TV broadcast and storage media, e.g. DVD, MPEG-4 for a moving picture format using low bit rates, used in, e.g. mobile communications, and MPEG-4 AVC (Advanced Video Coding) which was recently proposed with the aim of further high quality image communications at low bit rates.

When a mobile communication terminal operating on the premise of battery power adopts an MPEG system, it becomes a great concern that a vast quantity of data should be processed at high speed and power consumption therein should be reduced as well. From this viewpoint, a moving picture process-dedicated LSI installed in the mobile communication terminal uses together a processor and several pieces of dedicated hardware that process specific algorithms, such as a VLD (Variable Length Decoder), an IQ (Inverse Quantization) circuit, and an IDCT (Inverse Discrete Cosine Transform) circuit. In this way, the moving picture process-dedicated LSI distributes the load at the time of moving picture processing and reduces power consumption as well.

When the moving picture process-dedicated LSI is installed in an image processing device treating a plurality of coding systems and supports only one coding system, it is necessary to install in the image processing device a plurality of moving picture process-dedicated LSI's, each of which corresponds to each coding system.

However, if a plurality of moving picture process-dedicated LSI's is installed in the image processing device, the number of parts increases with accompanying increase in the cost of the image processing device, and the system will become complicated, since it is necessary to switch the plurality of moving picture process-dedicated LSI's to be operated for every coding system.

Therefore, it is possible to consider a device in which one moving picture process-dedicated LSI is made to treat the plurality of coding systems. Such a device may be realized by installing all necessary pieces of dedicated hardware such as VLD for every coding system. However, the device thus realized will result in increase of the area of the moving picture process-dedicated LSI, and hence in increase of the cost thereof.

Moreover, in order that one moving picture process-dedicated LSI is made to treat the plurality of coding systems, each dedicated hardware may be elaborately made to support each of the plurality of coding systems. As one of such resolutions, document 1 (Published Japanese patent application No. 2000-141807) discloses the art of the variable-length-code decoding circuit supporting two coding systems.

FIG. 7 shows the conventional variable-length-code decoding circuit 300 described by the document 1. The variable-length-code decoding circuit 300 comprises a barrel shifter 301, a barrel shifter controlling unit 302, a variable-length-code decoding table 303a for decoding of AC coefficients in a DV format and an MPEG format, a run length decoder 304 operable to process the run length of level 0, an escape processing circuit 303b dedicated for the MPEG format, a DC processing circuit 303c for each format, and an EOB processing circuit 303d for both formats.

When a bit stream of a DV format or an MPEG format is inputted, the processing circuit corresponding to each format calculates a run length and a level, and 0's are outputted as many as the number of the run length, thereby decoding the variable length code.

However, according to document 1, only two coding systems of DV and MPEG-1 or MPEG-2 can be supported. In order to support other coding systems, it is necessary to develop a circuit from the beginning according to a coding system to be supported, therefore, development man-hour increases. Furthermore, it is necessary to provide two kinds of tables etc. required for a variable length code decoding, one for DV and the other for MPEG-1 or MPEG-2. Therefore, compared with the case where it supports only one coding system, the circuit scale becomes larger and the cost of the moving picture process-dedicated LSI increases.

Therefore, the aim of the present invention is to provide a variable-length-code decoding device, which can support a plurality of coding systems easily, and suppress increase of the circuit scale.

BRIEF SUMMARY OF THE INVENTION

A first aspect of the present invention provides a variable length decoding device comprising: a decoding unit operable to decode different kinds of variable length codes encoded in accordance with a plurality of encoding systems; a stream input unit operable to input the different kinds of variable length codes; and an interface unit operable to interface the decoding unit with the stream input unit, wherein the stream input unit and the interface unit are commonly used in decoding the different kinds of variable length codes.

According to the above structure, since the stream input unit and the interface are shared in the plurality of coding systems, the circuit scale is reducible, compared with a case where a stream input unit is prepared for each coding system.

A second aspect of the present invention provides the variable length decoding device as defined in the first aspect, wherein the decoding unit comprises: a reconfigurable logic circuit operable to decode the different kinds of variable length codes encoded in accordance with the plurality of encoding systems.

According to the above structure, the decoding unit can be alternatively constructed by a single reconfigurable logical circuit. Therefore, the circuit scale can be further reduced.

A third aspect of the present invention provides the variable length decoding device as defined in the first aspect, wherein the decoding unit comprises: a plurality of decoders, each of the plurality of decoders being operable to decode each of the different kinds of variable length codes encoded in accordance with the plurality of encoding systems.

According to the above structure, the plurality of coding systems is supported by the plurality of dedicated decoders, without an overhead needed in reconstruction.

A fourth aspect of the present invention provides the variable length decoding device as defined in the third aspect, wherein the interface unit comprises: a decoder selector connected to the stream input unit and operable to select one of the plurality of decoders, according to a code system signal indicative of one of the plurality of encoding systems employed in encoding.

A fifth aspect of the present invention provides the variable length decoding device as defined in the fourth aspect, wherein a decoder not selected by the decoder selector among the plurality of decoders is controlled so as to suppress electric power consumption thereof.

According to these structures, by suppressing the power consumption that is otherwise used by the unchosen decoder, the variable length decoding device can be easily installed in a portable information terminal etc.

A sixth aspect of the present invention provides the variable length decoding device as defined in the first aspect, wherein the stream input unit comprises: a code detecting unit operable to detect a start code included in stream data.

According to the above structure, even if the start code is not removed in the preceding stage of the variable length decoding device, the variable length code can be decoded without trouble. Moreover, the code detector, which detects the start code, can also be shared in the plurality of coding systems; therefore, the increase in the circuit scale can be further suppressed.

A seventh aspect of the present invention provides the variable length decoding device as defined in the first aspect, wherein the stream input unit comprises: a shift register operable to store register data consisting of a part of stream data; a data selector operable to transfer the stream data in a fixed bit width from the shift register to the interface unit; and a pointer controlling unit operable to control a stream pointer to determine a position of the stream data, and wherein the interface unit comprises: a stream data bus operable to hold and transfer the stream data to the decoding unit; a stream enable signal line operable to hold and transfer a stream enable signal to the decoding unit, the stream enable signal being indicative of interruption of decoding; and a decoding start signal line operable to hold and transfer a decoding start signal to the decoding unit, the decoding start signal being indicative of start of the decoding.

According to the above structure, the register data of the shift register is divided into pieces of the stream data of fixed bit width, and transferred to the decoding unit. The above structure allows the stream pointer to be controlled, so that the stream data can be supplied to the decoding unit one by one, and the variable length code can be decoded efficiently. Moreover, it is possible to direct the decoding unit to interrupt the decoding by the stream enable signal, and to start the decoding by the decoding start signal.

An eighth aspect of the present invention provides the variable length decoding device as defined in the seventh aspect, wherein the decoding unit notifies the stream input unit of a code length upon completion of the decoding, and wherein the pointer controlling unit moves, in accordance with the notified code length, a position of the stream data to be pointed at by the stream pointer.

According to the above structure, the decoding unit notifies the stream input unit of the code length which is unknown before the completion of decoding, thereby, the position of stream data, which the stream pointer decides, is always appropriately controlled. That is, a handshake protocol can be established between the stream input unit and the decoding unit, and the difference in the latency by the decoding unit can be easily absorbed.

DETAILED DESCRIPTION OF THE INVENTION

Embodiments of the present invention are now explained, with reference to the accompanying drawings.

Embodiment 1

Figure 1:
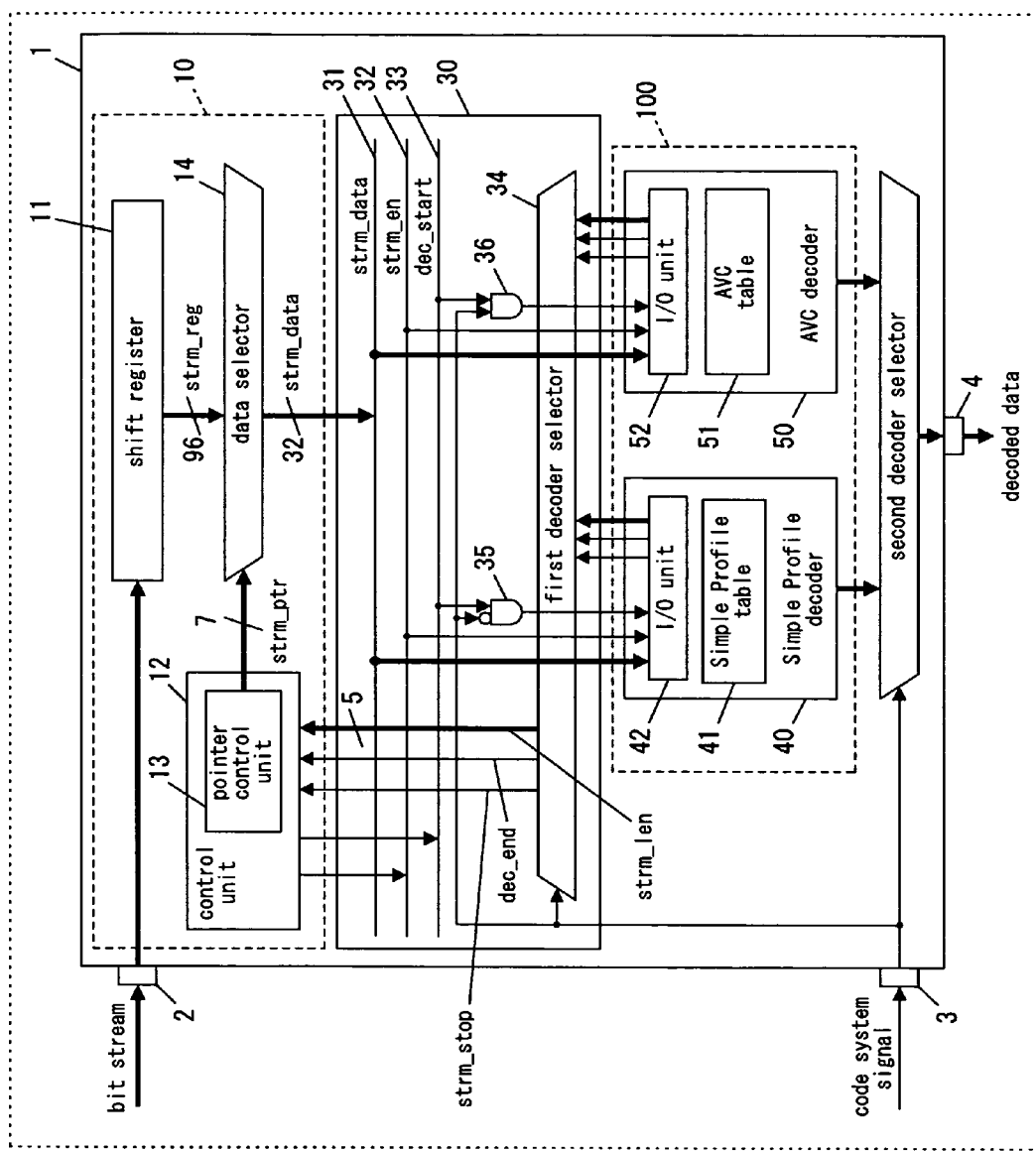
FIG. 1 is a block diagram illustrating a variable-length-code decoding device in Embodiment 1 of the present invention.

FIG. 1 is a block diagram illustrating a variable length decoding device in Embodiment 1 of the present invention.

The variable length decoding device 1 of the present embodiment comprises, as described bellow, a decoding unit 100 operable to decode variable length codes encoded in conformity with a plurality of coding systems, a stream input unit 10 operable to input the variable length codes, an interface 30 operable to interface the decoding unit 100 with the stream input unit 10. The stream input unit 10 and the interface 30 are shared for the plurality of coding systems.

As shown in FIG. 1, the variable length decoding device 1 of the present embodiment further comprises a stream input terminal 2, a code system signal input terminal 3, and a decoded data output terminal 4.

The stream input terminal 2 inputs bit streams encoded by variable length coding. Although the variable length decoding device 1 can decode the bit streams encoded by the plurality of coding systems, the coding system of the bit stream to be decoded currently is specified by a code system signal inputted into the code system signal input terminal 3.

The bit stream inputted from the stream input terminal 2 is transferred to a shift register 11 of the stream input unit 10 by every given quantity (96 bits in the present example).

The code system signal inputted from the code system signal input terminal 3 is fed into a first decoder selector 34, a second decoder selector 60, and each one of input terminals of a first mask element 35 and a second mask element 36.

The decoded data output terminal 4 outputs the decoded data, which is output data of the variable length decoding device 1, to the exterior (usually to an inverse quantizer (not shown) in the present example, since the variable length decoding device is of the MPEG standard).

The internal elements of the variable length decoding device 1 can be divided into the stream input unit 10, the decoding unit 100 which possesses a first decoder 40 and a second decoder 50, the interface 30 installed to interface the stream input unit 10 with the decoding unit 100, and the second decoder selector 60.

Figure 2:
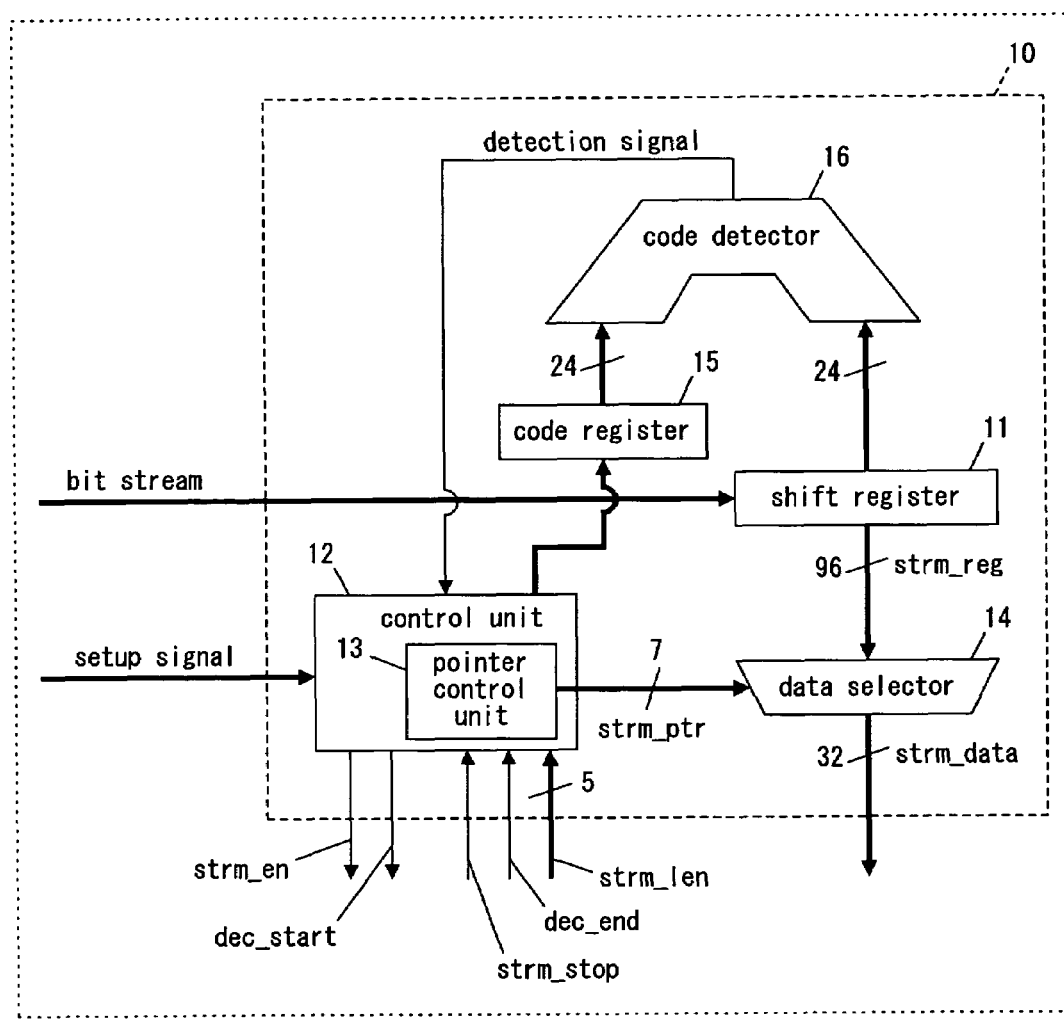
FIG. 2 is a block diagram illustrating a stream input unit in Embodiment 1 of the present invention.

The stream input unit 10 of the present example comprises the following elements, as shown in FIG. 2.

The shift register 11 stores partial data of the bit stream up to 96 bits, as mentioned above. In the present embodiment, the data stored at the shift register 11 is called register data strm_reg.

A control unit 12 controls the decoding process of the variable length decoding device 1. The control unit 12 includes a pointer control unit 13, which indicates a stream pointer strm_ptr to a data selector 14.

Upon inputting the stream pointer strm_ptr from the pointer control unit 13, the data selector 14 reads out a given amount of stream data strm_data (32 bits in the present example) from the tail position indicated by the stream pointer strm_ptr, and transfers the read steam data to a stream data bus 31. Theoretically, the tail position of stream data strm_data, which the stream pointer strm_ptr indicates, may be changed in a range of 95 bits-0 bit.

However, in the present example as mentioned later, the pointer control unit 13 controls the stream pointer strm_ptr such that the tail position does not become less than 32 bits, which is the data width of the stream data strm_data outputted by the data selector 14.

This is because, when the tail position becomes less than 32 bits, there is a possibility that the stream data strm_data to be transferred to the stream data bus 31 may include meaningless data in part at least, causing an unexpected situation to occur. Incidentally, when the tail position becomes less than 32 bits, new partial data of the bit stream is transferred to the shift register 11 supplementarily.

The contents of the stream data strm_data transferred to the stream data bus 31 change as the tail position indicated by the stream pointer strm_ptr returns toward the direction of 0 bit from the maximum of 95 bits. In order to simplify the explanation in the following, it is assumed that the stream pointer strm_ptr decreases fundamentally from the maximum of 95 bits towards the direction of 0 bit at every fixed difference value (8 bits in the present example). However, the above description is for the sake of explanation, the difference value is exactly a code length's value indicated by a code length signal strm_len described later, but changes, in fact, with the code length's value (a variable value) indicated by the code length signal strm_len at the time of decoding being completed. In this way, the present invention can be equally applied to the case where the difference value changes.

The control unit 12 outputs a bit stream enable signal strm_en to a stream enable signal line 32 of the interface 30, and a decoding start enable signal dec_start to a decoding start signal line 33 of the interface 30.

The bit stream enable signal strm_en indicates whether decoding should be interrupted or not, and the decoding start enable signal dec_start indicates whether decoding may be started or not.

The control unit 12 inputs a code length signal strm_len, a decoding end notifying signal dec_end, and a supply stop signal strm_stop from the first decoder selector 34. The explanation for the code length signal strm_len is as described above.

The decoding end notifying signal dec_end is a signal with which the decoder in charge of decoding notifies the control unit 12 that, when the processing about the stream data strm_data is completed, with the completion of the decoding of the present variable length encoded data, the state is reached where the code length signal strm_len can be specified.

The supply stop signal strm_stop is a signal with which the decoder in charge of decoding notifies the control unit 12 of the completion of the processing, whenever the processing about the stream data strm_data is completed.

However, the supply stop signal strm_stop differs from the decoding end notifying signal dec_end in that the former is notified to the control unit 12 even when the decoding of the present variable length encoded data is not completed.

The stream input unit 10 of the present example further comprises the following elements. However, the following elements can be omitted if needed, when a specific code of the bit stream (a start code "0x000001" in the present example) does not need to be manipulated (for example, when the start code is beforehand removed by an element (not shown), which is provided in the preceding stage of the stream input terminal 2).

A code register 15 holds the start code and feeds the start code to one input terminal of a code detector 16. The code detector 16 inputs, from the other input terminal thereof, the value of first 24 bits of the shift register 11, and compares the value with the start code inputted from the code register 15. When both agree, the code detector 16 outputs to the control unit 12 a detection signal which notifies that the start code is discovered.

The control unit 12, upon inputting the detection signal, returns the stream pointer strm_ptr outputted by the pointer control unit 13 by 24 bits toward the direction of 0 bit. Consequently, the data of 32 bits from the next bit of the start code of the bit stream is transferred to the stream data bus 31 as stream data strm_data, and the decoding process begins. In order to simplify the following explanation, it is assumed that when the start code is discovered, the shift register 11 is refilled with a part of data of the bit stream by the amount of the start code (24 bits in the present example) and the stream pointer strm_ptr starts from the maximum value of 95 bits.

In addition, it may be allowed that the specific code which the code register 15 stores can be altered by a setup signal which the control unit 12 inputs from the outside. When the specific code has been accidentally decoded as a part of substance of the variable length encoded data, the pointer control unit 13 may operate suitably and correct the stream pointer strm_ptr, so that the right original decoding process may be performed.

As shown in FIG. 1, the interface 30 comprises the following elements in addition to the stream data bus 31, the stream enable signal line 32, and the decoding start signal line 33.

A first decoder selector 34 selects either the signals fed by the first decoder 40 (the supply stop signal strm_stop, the decoding end notifying signal dec_end and the code length signal strm_len) or the signals fed by the second decoder 50 (the supply stop signal strm_stop, the decoding end notifying signal dec_end and the code length signal strm_len) in an alternative way according to the code system signal, and transfers the selected signals to the control unit 12.

A first mask element 35 and a second mask element 36 calculate the logical product of the decoding start enable signal dec_start and the code system signal. The first mask element 35 and the second mask element 36 select either the first decoder 40 or the second decoder 50 in an alternative way according to the code system signal, and make the selected decoder decode the stream data strm_data transferred from the stream data bus 31. The first mask element 35 and the second mask element 36 are mutually reversed in logic.

The first decoder 40 and the second decoder 50 constitute the decoding unit 100 in Embodiment 1, and each serves as an exclusive decoder for use in a mutually different coding system. In the present example, the first decoder 40 comprises a first table 41, decodes variable length encoded data in conformity with an MPEG-4 Simple Profile system, and outputs the decoded data to one of the terminals of the second decoder selector 60. In addition, an I/O unit 42 inputs and outputs signals from and to the interface 30.

The second decoder 50 comprises a second table 51, decodes variable length encoded data in conformity with an MPEG-4 AVC system, and outputs the decoded data to another of the terminals of the second decoder selector 60. In addition, an I/O unit 52 inputs and outputs signals from and to the interface 30.

According to the code system signal, the second decoder selector 60 outputs the decoded data outputted from either the first decoder 40 or the second decoder 50 to the exterior of the variable length decoding device 1 via the decoded data output terminal 4.

Here, as for the decoder that is not selected according to the code system signal, it is desirable to stop a clock or not to supply electric power etc. thereto, thereby substantially halting the operation thereof. It is because power consumption can be saved. Moreover, the decoder is not restricted to two kinds as shown in FIG. 1, but alternatively more decoders may be installed so as to support three or more kinds of variable length coding systems.

Figure 3:
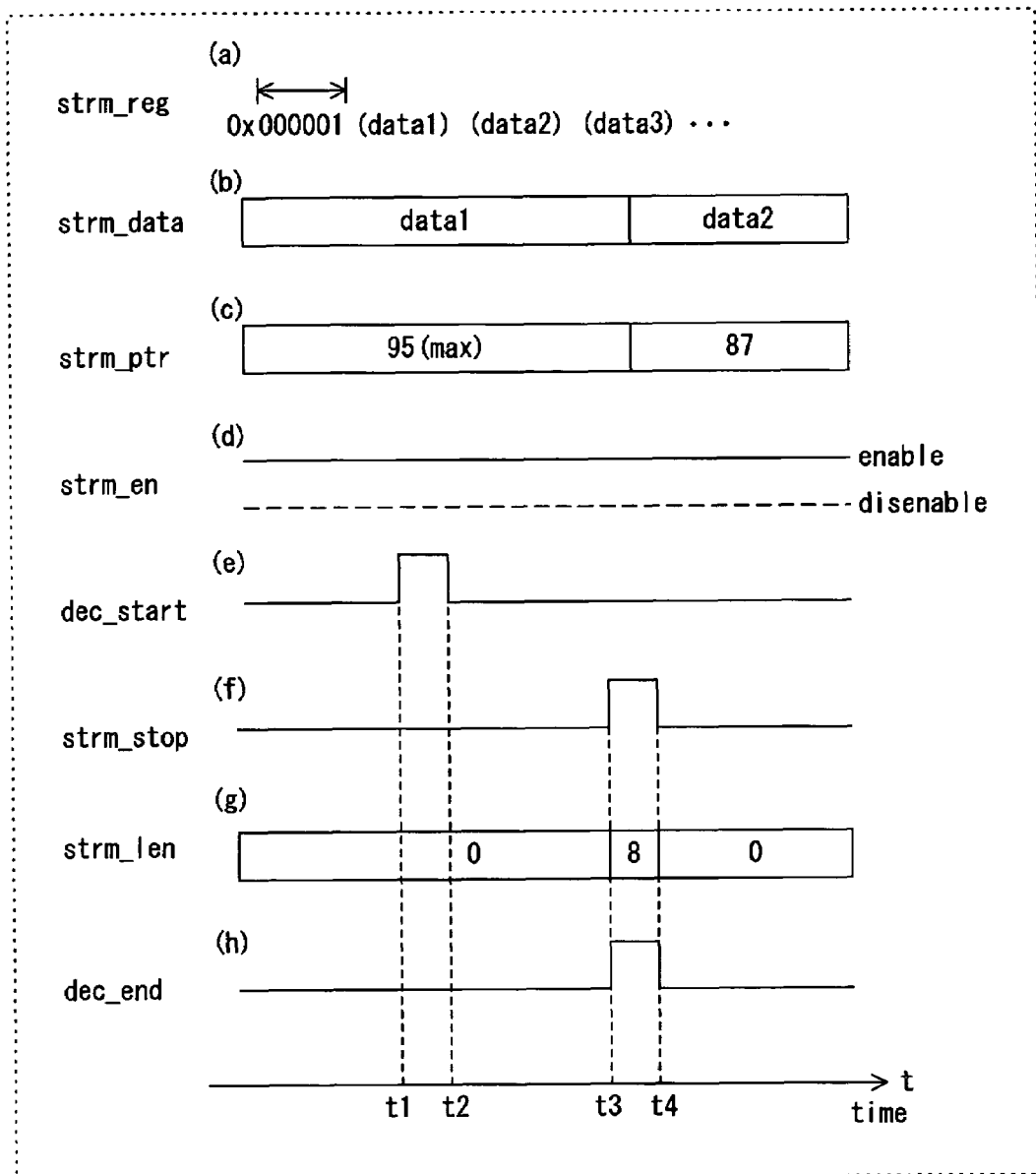
FIG. 3 is a timing chart of the variable-length-code decoding device in Embodiment 1 of the present invention.

Next, operation of the variable length decoding device 1 is explained, with reference to FIG. 3. Even when the code system signal selects either decoder of the first decoder 40 and the second decoder 50, the operation of the variable length decoding device 1 is same except for the selection operation.

(A case where when the data selector 14 transfers stream data strm_data to the stream data bus 31 only once, decoding of one unit is completed)

In the present case, it is assumed that the register data strm_reg shown in FIG. 3 (a) is transferred to the shift register 11. As stated above based on FIG. 2, the code detector 16 performs comparison with the code register 15, detects a leading start code "0x000001", and 24-bit data is refilled into the shift register 11.

The pointer control unit 13 sets the stream pointer strm_ptr to 95 bits, that is, the maximum value of the shift register 11, and the data selector 14 transfers, to the stream dada bus 31, the stream data strm_data of 32 bits (data1) from the tail position indicated by the stream pointer strm_ptr.

As shown in FIG. 3 (d), since the present stream pointer strm_ptr points 32 bits or more, the control unit 12 turns the bit stream enable signal strm_en to "enable", and as shown in FIG. 3 (e), the control unit 12 turns the decoding start enable signal dec_start to "start" in time t1-t2.

Since the first decoder 40 is not decoding any data at this time, the first decoder 40 sets the code length's value indicated by the code length signal strm_len to "0", as shown in FIG. 3 (g), and turns the supply stop signal strm_stop to "not stop", as shown in FIG. 3 (f). Furthermore, as shown in FIG. 3 (h), the decoding end notifying signal dec_end is in the state of "not end".

It is assumed that the first decoder 40 starts decoding of the stream data stm_data (data1) from time t1, and completes the decoding of one unit using only the stream data strm_data (data1) at time t3. Then, the code length of the current one unit becomes clear for the first time (the code length changes depending on stream data strm_data, however, as stated above, in order to simplify explanation, the present example assumes that the code length is always 8 bits).

Therefore, in time t3-t4, the first decoder 40 turns the supply stop signal strm_stop to "stop", the decoding end notifying signal dec_end to "end", and sets the code length's value indicated by the code length signal strm_len to "8". These signals are notified to the control unit 12 via the first decoder selector 34.

Moreover, at time t4, the first decoder 40 returns the supply stop signal strm_stop to "not stop", resets the code length's value indicated by the code length signal strm_len to "0", and returns the decoding end notifying signal dec_end to "not end", respectively.

At time t3, the control unit 12 that receives these signals returns the stream pointer strm_ptr toward the direction of 0 bit by the value of the code length signal stm_len (8 bits in the present example) which is received using the pointer control unit 13. Consequently, the stream pointer strm_ptr is changed to point 87 bits (95−8=87).

Next, processing same as stated above is carried out for data2.

(A case where, even when the data selector 14 transfers the stream data strm_data to the stream data bus 31 once, decoding of one unit is not completed)

Figure 4:
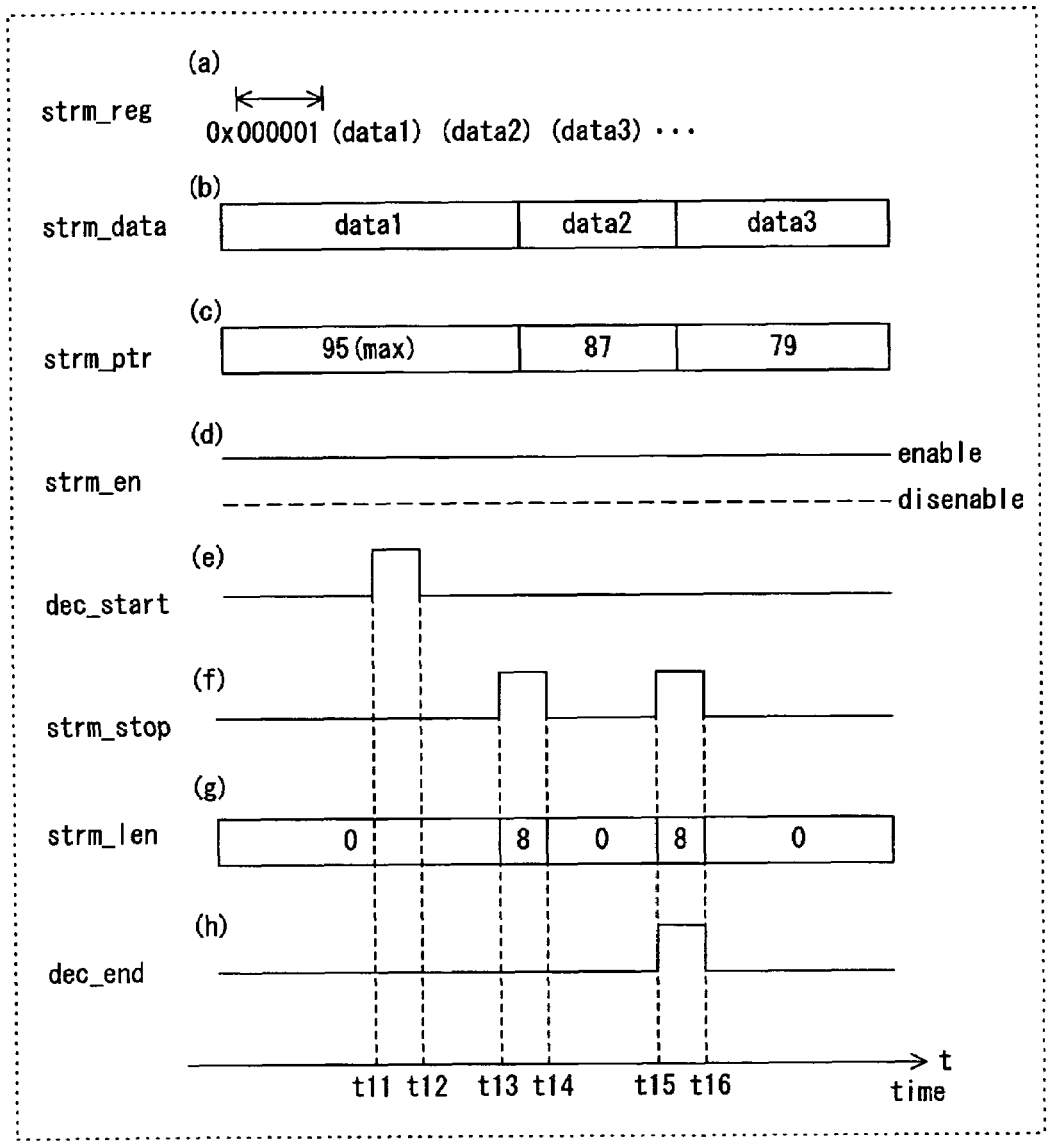
FIG. 4 is a timing chart of the variable-length-code decoding device in Embodiment 1 of the present invention.

With reference to FIG. 4, a case is explained where decoding of one unit is not completed even when the data selector 14 transfers stream data strm_data to the stream data bus 31 only once, and the data selector 14 transfers the stream data strm_data multiple times (2 times in the present example).

In FIG. 4, the process is the same as that of FIG. 3 up to time t11 and t12.

At time t13, when the first decoder 40 completes processing of the stream data strm_data (data1) but decoding of one unit is not completed, the supply stop signal strm_stop and the code length signal strm_len are the same as those shown in FIG. 3. However, as shown in FIG. 4 (h), the first decoder 40 leaves the decoding end notifying signal dec_end indicating "not end".

Thereby, the following stream data strm_data (data2) is transferred to the first decoder 40 at time t13 or later, and the first decoder 40 performs processing of the stream data strm_data (data2) uninterruptedly. Consequently, when decoding of one unit is completed and the state where the code length can be specified is reached, the first decoder 40 performs, in time t15-t16, the same processing as in time t4-t5 of FIG. 3.

Incidentally, in the present example, the code length signal strm_len indicates 8 bits in time t13-t14 and t15-t16, however, this is not an error. The reason is as follows.

Namely, the stream pointer strm_ptr moves, at time t13, toward the direction of 0 bit by the code length len1 (8 bits in the present example), which is tentatively clarified by the stream data stm_data (data1). Furthermore at time t15, the stream pointer strm_ptr moves by the code length len2 (8 bits in the present example), which is clarified by the stream data strm_data (data2). After all, at time t15, the stream pointer strm_ptr points out correctly the position which is moved from the position at the time when the decoding of data1 is started by the code length's sum (len1+len2=16 bits in the present example).

Figure 5:
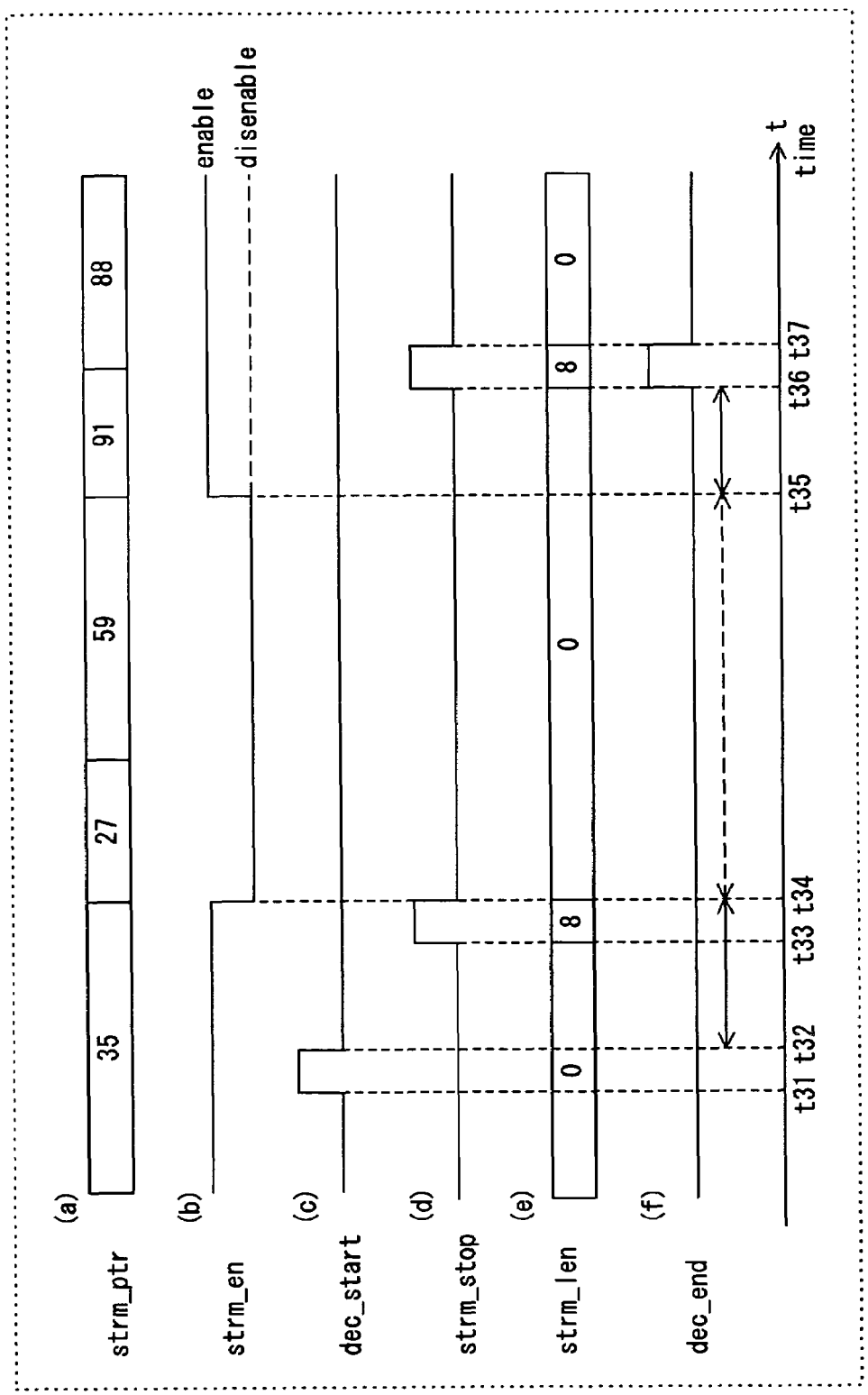
FIG. 5 is a timing chart of the variable-length-code decoding device in Embodiment 1 of the present invention.

Next, with reference to FIG. 5, operation of the variable length decoding device 1 is explained for a case where the stream pointer strm_ptr becomes less than the bit width of the stream data strm_data (32 bits in the present example) and data of the following part of the bit stream is refilled to the shift register 11.

As already explained with reference to FIG. 3 and FIG. 4, when the decoding advances, the stream pointer strm_ptr returns toward the direction of 0 bit, and finally becomes less than the bit width of the stream data strm_data.

In the example of FIG. 5, up to time t31-t33, the stream pointer strm_ptr indicates 35 bits, which is greater than the bit width of the stream data strm_data.

At time t33, when the first decoder 40 outputs the code length signal strm_len (8 bits), the stream pointer strm_ptr indicates a value less than 32 bits (35−8=27).

In this case, as shown in FIG. 5 (b), the control unit 12 turns the bit stream enable signal strm_en to "disenable" at time t34, in order to avoid a situation where unexpected data is included in the stream data strm_data.

Consequently, when the first decoder 40 is performing the decoding processing after time t32, the first decoder 40 suspends the decoding processing from time t34.

In the example of FIG. 5, after time t34, 32-bit data is refilled to the shift register 11 from the bit stream, and the control unit 12 returns the bit stream enable signal strm_en to "enable" at time t35. As the result, at time t35, the suspension of the decoding processing is canceled and the first decoder 40 completes the decoding of one unit at time t36. The operation henceforth is the same as the operation described above.

According to the present embodiment, since the stream input unit 10 and the interface 30 are shared in the plurality of coding systems, the increase in circuit area is suppressed. Moreover, since the code length is sent to the control unit 12 from the decoding unit 100, a decoder supporting a different coding system is also easily connectable.

In the present embodiment, the coding systems assume to be two kinds, "MPEG-4 Simple Profile" and "MPEG-4 AVC"; however, other coding systems will be supported by installing other variable-length-code decoding units that support the other coding systems and connecting them to the interface 30.

In addition, the numeric values described above, such as 96 bits, 32 bits, and 8 bits etc., are merely examples, and, needless to say, the values can be changed variously. Moreover, the stream pointer strm_ptr controls the stream data strm_data in ascending order; however, the stream pointer strm_ptr may alternatively control the stream data strm_data in descending order Embodiment 2

The following explains only differences with Embodiment 1. In Embodiment 1, the decoders 40 and 50 of exclusive use are provided for every one of the plurality of coding systems.

Alternatively, in Embodiment 2, a decoding unit 200 comprises a reconfigurable decoder 80, which possesses an I/O unit 81.

All of the reconfigurable decoder 80 can be composed of reconfigurable logical circuits, or, only a table storing decoding parameters, for example, may be composed of a reconfigurable logical circuit. Anyway, it is enough if the decoding processing which can support a plurality of coding systems is realized with the reconfigurable decoder 80.

Figure 6:
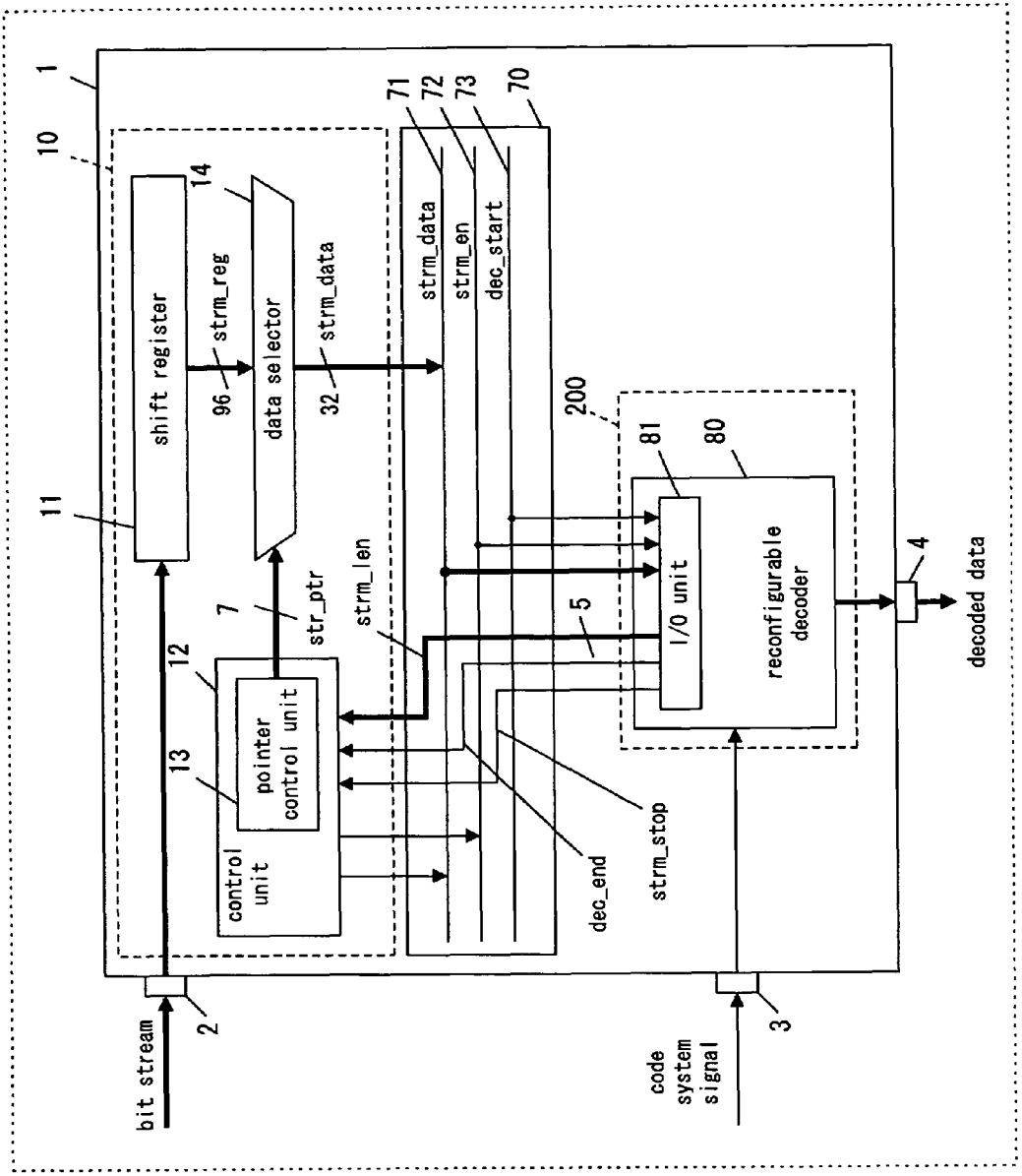
FIG. 6 is a block diagram illustrating a variable-length-code decoding device in Embodiment 2 of the present invention.
Figure 7:
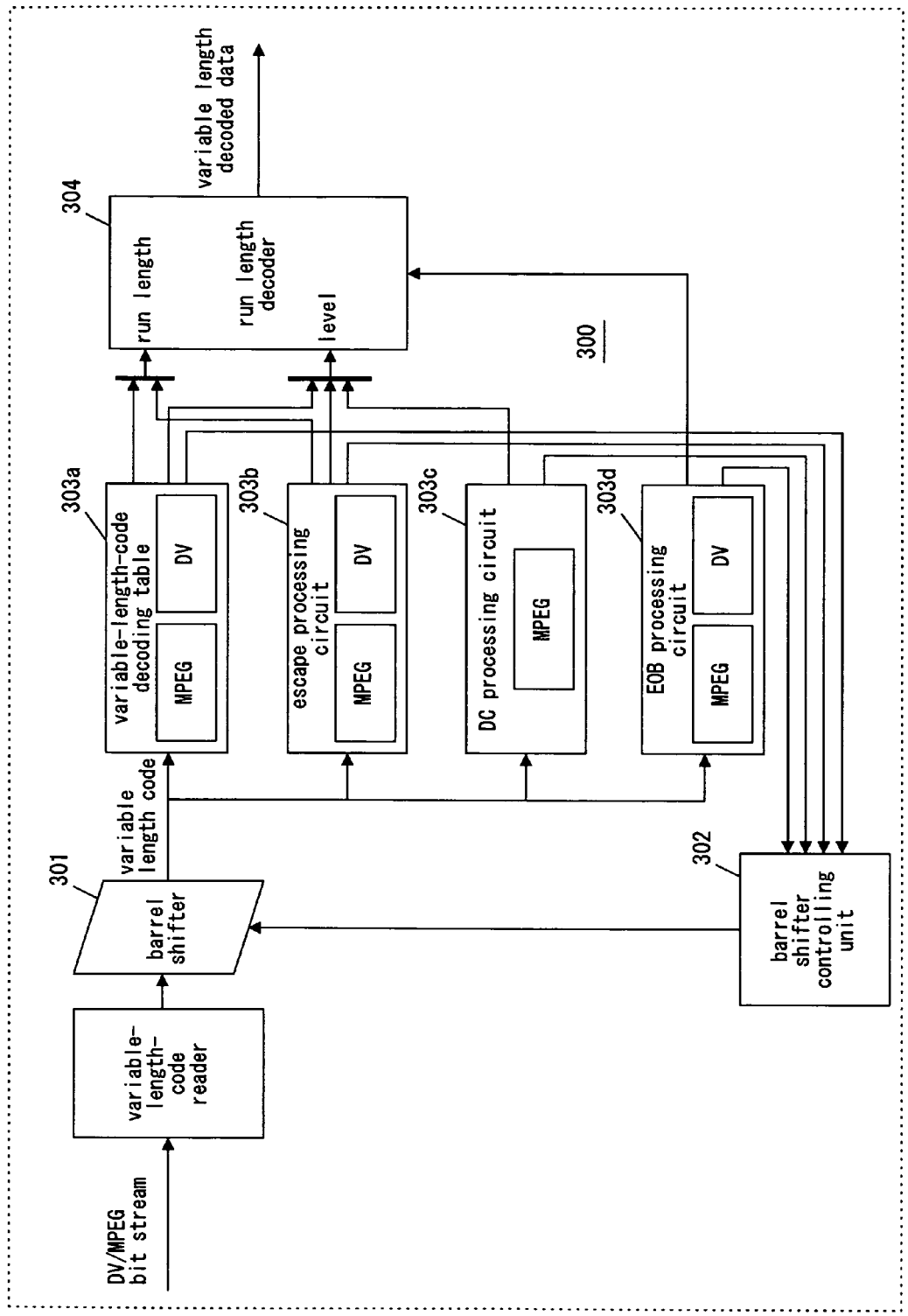
FIG. 7 is a block diagram illustrating the conventional variable length decoding device.

As clearly seen from FIG. 6 in comparison with FIG. 1, it is sufficient that an interface 70 comprises only a stream data bus 71, a stream enable signal line 72, and a decoding start signal line 73, and the first decoder selector 34, the first mask element 35, the second mask element 36, etc. are omissible. Moreover, it is not necessary to provide the second decoder selector 60 between the reconfigurable decoder 80 and the decoded data output terminal 4.

Therefore, in Embodiment 2, the circuit scale is further reducible from the counterpart in Embodiment 1. Needless to say, in FIG. 1, the reconfigurable decoder 80 can be provided instead of the first decoder 40, and the second decoder 50 may be removed from the structure.

According to the variable-length-code decoding device of the present invention, in the variable-length-code decoding device that must support a plurality of coding systems, the decoding unit shares the stream input unit, therefore, the increase in circuit area can be suppressed. Moreover, the common interface connects the decoding unit and the stream input unit in a plurality of coding systems, therefore, connection of the decoding unit becomes easy, and applicability to other combinations of coding systems is readily maintained.

The variable-length-code decoding device according to the present invention is preferably applied to, for example, a system LSI that performs a moving picture processing and is required to support a plurality of coding systems, or the applied technical field thereof.

The invention claimed is:

1. A variable length decoding device comprising:
a decoding unit operable to decode different kinds of variable length codes encoded in accordance with a plurality of encoding systems;
a stream input unit operable to input the different kinds of variable length codes; and
an interface unit operable to interface said decoding unit with said stream input unit,
wherein said stream input unit and said interface unit are commonly used in decoding the different kinds of variable length codes,
wherein said decoding unit notifies said stream input unit of a code length upon completion of the decoding of the different kinds of variable length codes, and
wherein a position of stream data is always appropriately controlled, such that a handshake protocol can be established between said stream input unit and said decoding unit, and such that a difference in a latency by said decoding unit can be absorbed.

2. The variable length decoding device as defined in claim 1, wherein said stream input unit comprises:
a shift register operable to store register data consisting of a part of stream data;
a data selector operable to transfer the stream data in a fixed bit width from said shift register to said interface unit; and
a pointer controlling unit operable to control a stream pointer to determine a position of the stream data.

3. The variable length decoding device as defined in claim 2,
wherein said pointer controlling unit moves, in accordance with the notified code length, a position of the stream data to be pointed at by the stream pointer.

4. The variable length decoding device as defined in claim 2, wherein said interface unit comprises:
a stream data bus operable to hold the stream data and transfer the stream data to said decoding unit;
a stream enable signal line operable to hold a stream enable signal and transfer the stream enable signal to said decoding unit, the stream enable signal indicating an interruption of decoding; and
a decoding start signal line operable to hold a decoding start signal and transfer the decoding start signal to said decoding unit, the decoding start signal indicating a start of the decoding.

* * * * *